United States Patent
Rho

(10) Patent No.: US 7,864,616 B2
(45) Date of Patent: Jan. 4, 2011

(54) BULK VOLTAGE DETECTOR

(75) Inventor: Kwang-Myoung Rho, Ichon (KR)

(73) Assignee: Hynix Semiconductor Inc. (KR)

( * ) Notice: Subject to any disclaimer, the term of this patent is extended or adjusted under 35 U.S.C. 154(b) by 123 days.

(21) Appl. No.: 12/172,878

(22) Filed: Jul. 14, 2008

(65) Prior Publication Data

US 2009/0147611 A1 Jun. 11, 2009

(30) Foreign Application Priority Data

Dec. 7, 2007 (KR) .................. 10-2007-0126671

(51) Int. Cl.
*G11C 11/00* (2006.01)
(52) U.S. Cl. ..................... 365/226; 365/205
(58) Field of Classification Search ............... 365/226, 365/205
See application file for complete search history.

(56) References Cited

U.S. PATENT DOCUMENTS

| 7,366,048 | B2 | 4/2008 | Byeon | |
| 7,560,978 | B2 * | 7/2009 | Byeon et al. | ................ 327/536 |
| 2006/0023519 | A1 * | 2/2006 | Choi et al. | ............ 365/189.09 |
| 2007/0200600 | A1 | 8/2007 | Kang | |
| 2007/0278554 | A1 * | 12/2007 | Song et al. | .................. 257/314 |
| 2009/0009229 | A1 * | 1/2009 | Ker et al. | .................... 327/333 |

FOREIGN PATENT DOCUMENTS

| JP | 05160716 | 6/1993 |
| JP | 05160716 A | 6/1993 |
| JP | 07-303369 | 11/1995 |
| KR | 100142967 | 4/1998 |
| KR | 100142967 B1 | 4/1998 |
| KR | 1020000060985 | 10/2000 |
| KR | 1020070030092 | 3/2007 |
| KR | 1020070030092 A | 3/2007 |

* cited by examiner

*Primary Examiner*—Michael T Tran
(74) *Attorney, Agent, or Firm*—Baker & McKenzie LLP

(57) ABSTRACT

A bulk voltage detector comprises a voltage sensor configured to receive a bulk voltage and compare the received bulk voltage with a target level to provide a first detection signal having a voltage gain that is increased within a predetermined voltage range around the target level, and an amplifier coupled with the voltage sensor, the amplifier configured to receive the first detection signal and invert and amplify the first detection signal.

14 Claims, 5 Drawing Sheets

BULK VOLTAGE DETECTOR

CROSS-REFERENCES TO RELATED APPLICATIONS INFORMATION

The present application claims priority under 35 U.S.C. 119(a) to Korean application number 10-2007-0126671 filed in the Korean Intellectual Property Office on Dec. 7, 2007, which is incorporated herein by reference in its entirety as if set forth in full.

BACKGROUND

1. Technical Field

The embodiments described herein relate to a voltage detection circuit for use in a semiconductor memory device, and more particularly, to a bulk voltage detector.

2. Related Art

In general, a semiconductor memory device uses internal voltages having various potential levels. The internal voltages includes a bit line pre-charge voltage (VBLP), a peak-to-peak voltage (VPP), a bulk voltage (hereinafter, referred to as 'VBB'), and the like.

The bulk voltage (VBB) is a voltage applied to a bulk of a semiconductor substrate and has a negative voltage level that is lower than a ground voltage (VSS). This can result in a voltage difference between the semiconductor substrate and a source of a cell transistor. The voltage difference is called a body effect and the threshold voltage of the cell transistor is increased by the body effect. The increase in the threshold voltage decreases a leakage current of a MOS (Metal Oxide Semiconductor) transistor. The increased threshold voltage also increases the cell data retention time, thereby improving the refresh characteristic of the memory device.

A detector for comparing whether the bulk voltage is higher or lower than a bulk voltage (VBB) at a target level, an oscillator for generating an oscillation periodic signal according to an output signal of the detector, and a pumping circuit for generating the bulk voltage (VBB) are required to generate the bulk voltage (VBB). In particular, the detector should also be designed to have high sensitivity so as to sense a minute change in the bulk voltage (VBB). The detector should also be designed to have a high voltage gain.

Further, fluctuations of PVT (Process, Voltage, and Temperature) should produce only a small fluctuation or a low skew of the bulk voltage (VBB). However, the skew is closely associated with the sensitivity of the detector. When the sensitivity of the detector is high, the skew of the bulk voltage (VBB) increases. As a result, there is a trade-off relationship between the sensitivity of the detector and skew of the voltage level.

SUMMARY

A bulk voltage detector having a high-sensitivity characteristic and a low-skew characteristic is described herein.

In one aspect, a bulk voltage detector comprises a voltage sensor configured to receive a bulk voltage and compare the received bulk voltage with a target level to provide a first detection signal having a voltage gain that is increased within a predetermined voltage range around the target level, and an amplifier coupled with the voltage sensor, the amplifier configured to receive the first detection signal and invert and amplify the first detection signal.

In another aspect, A bulk voltage detector comprises a voltage sensor configured to receive a bulk voltage and compare the received bulk voltage with a target level to provide a first detection signal, and an amplifier coupled with the voltage sensor, the amplifier configured to receive the first detection signal and invert and amplify the first signal, wherein the voltage sensor includes a voltage gain adjusting unit that operates within in a saturation area within a predetermined voltage range of the voltage around the target level.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

A voltage sensor configured to sense the bulk voltage in accordance with the embodiments described herein can include a voltage gain adjusting unit. The voltage gain adjusting unit can be configured to improve sensitivity of the detector. For example, as described below in accordance with the embodiments described herein, it is possible to make the skew of a sensed bulk voltage (VBB) small by compensating for a characteristic of certain element according to fluctuations in the PVT. Accordingly, it is feasible to provide the bulk voltage (VBB) at a target level even under negative processing and operating conditions via a bulk voltage detector having high sensitivity and/or by making the level skew of a voltage sensed by the bulk voltage detector small.

Figure 1:
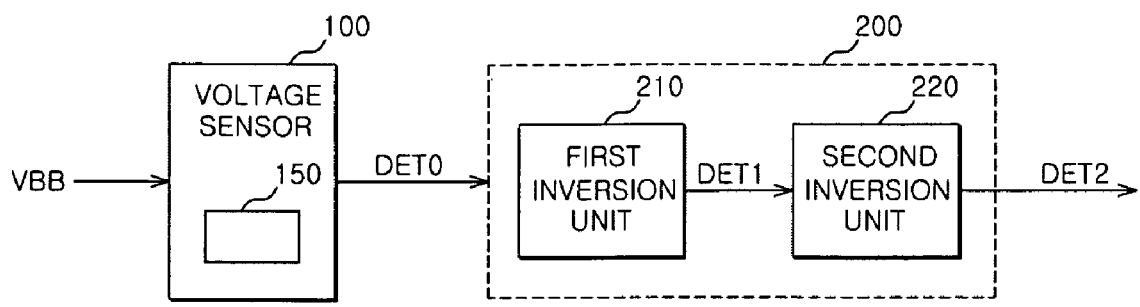
FIG. 1 is a block diagram illustrating a bulk voltage detector according to one embodiment.

FIG. 1 is a block diagram illustrating a bulk voltage detector 10 according to one embodiment. Referring to in FIG. 1, the bulk voltage detector 10 can include a voltage sensor 100 and an amplifier 200.

The voltage sensor 100 can be configured to receive a bulk voltage (VBB) as a feedback signal from a pumping unit (not shown) on an internal voltage generating circuit and to sense whether the feedback-received bulk voltage (VBB) is higher or lower than a target level. The voltage sensor can be configured to then provide a first detection signal 'DET0' based on the determination. The voltage sensor 100 can include a voltage gain adjusting unit 150. The voltage gain adjusting unit 150 can be configured to control the voltage gain of the first detection signal 'DET0' to keep fluctuations in the first detection signal 'DET0', which are representative of fluctuations of the bulk voltage (VBB) within a predetermined range about the target level.

The amplifier 200 can be configured to generate a third detection signal 'DET2', which can be an amplified version of the first detection signal 'DET0'. The first detection signal 'DET0' can be a weak signal, thus the need to amplify it. For example, the third detection signal 'DET2' can amplify the first detection signal 'DET0' to a CMOS level.

The amplifier 200 can include a first inversion unit 210 and a second inversion unit 220. The first inversion unit 210 can be configured to generate a second detection signal 'DET1' by inverting the first detection signal 'DET0'. The second inversion unit 220 can be configured to generate the third detection signal 'DET2' by inverting the second detection signal 'DET1'. The third detection signal 'DET2' can comprise a required output logic level, and can correspond to the sensed weak bulk voltage (VBB).

Accordingly, when the third detection signal 'DET2' is at a high level, the bulk voltage (VBB) can be controlled to have a value close to a target value by actuating a pumping unit. On the contrary, when the third detection signal 'DET2' is at a low level, the pumping is not actuated.

Figure 2:
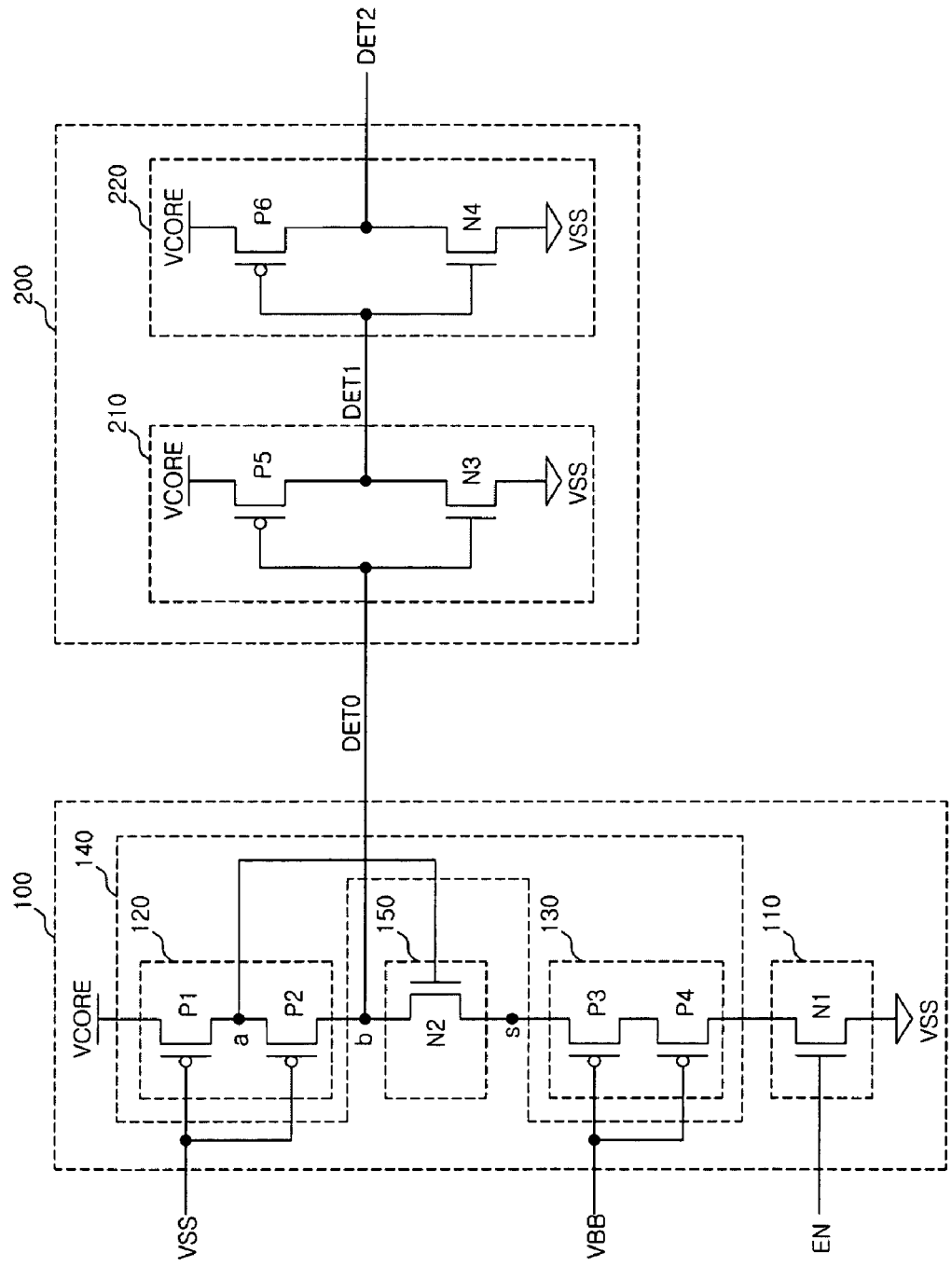
FIG. 2 is a detailed circuit diagram illustrating a bulk voltage detector that can be included in the bulk voltage detector shown in FIG. 1.

FIG. 2 is a detailed circuit diagram illustrating the voltage sensor 100 and the amplifier 200 in more detail. Referring to FIG. 2, the voltage sensor 100 can include a control unit 110, a voltage dividing unit 140, and a voltage gain adjusting unit 150.

First, the control unit 110 can be configured to control activation of the voltage sensor 100 in response to an activation signal 'EN'. That is, when the activation signal 'EN' is at, e.g., a high level, operation of the voltage sensor 100 can be activated.

The control unit 110 can include a first NMOS transistor N1. The first NMOS transistor N1 can include a gate configured to receive the activation signal 'EN', a source configured to be applied with ground power VSS, and a drain configured to connect to the voltage dividing unit 140. The voltage dividing unit 140 can be controlled by the control unit 110 and the voltage gain adjusting unit 150 and can be configured to provide the first detection signal 'DET0' by sensing the feedback-received bulk voltage (VBB).

The voltage dividing unit 140 can include a first dividing unit 120 and a second dividing unit 130.

The first dividing unit 120 can operate independent of the bulk voltage (VBB). That is, the first dividing unit 120 can be configured to provide to a node 'b' an internal voltage (VCORE) divided at a resistance ratio of a MOSFET transistor in response to the ground voltage VSS. More specifically, the first dividing unit 120 can include first and second PMOS transistors P1 and P2 that are connected to each other in series. The first PMOS transistor P1 can include a gate applied with the ground voltage VSS, a source applied with the internal voltage (VCORE), and a drain connected to a node 'a'. The second PMOS transistor P2 can include the gate configured to be applied with the ground voltage VSS, the source configured to connect to the node 'a', and a drain configured to connect to the node 'b'. The first and second PMOS transistors P1 and P2 can be configured to operate while maintaining a difference between the gate and a threshold voltage constantly. Herein, the internal voltage (VCORE) is a voltage dropped and adjusted from an external supply voltage VDD. Therefore, the voltage dividing unit 140 can be less influenced by the fluctuations of the external supply voltage VDD.

The second dividing unit 130 can be configured to sense a voltage at the resistance ratio of the MOSFET transistor by receiving the bulk voltage (VBB). The second dividing unit 130 can include third and fourth PMOS transistors P3 and P4. The third and fourth PMOS transistors P3 and P4 can be exemplified as transistors sized to provide a bulk voltage at a predetermined target level to the node b by further dividing down the voltage (VCORE).

Accordingly, when the feedback-received bulk voltage (VBB) is larger than or smaller than the target level, the potential of the node b can fluctuate, causing the first detection signal 'DET0' to fluctuate. That is, the potential level of the node 'b' can be varied by varying the turn-on resistance of PMOS transistors P3 and P4 according to the voltage level of the feedback-received bulk voltage (VBB). The third and fourth PMOS transistors P3 and P4 can also be configured to connect to each other in series to sense the bulk voltage (VBB) received at a MOSFET resistance ratio of the third and fourth PMOS transistors P3 and P4.

Therefore, the third PMOS transistor P3 can include a gate configured to receive the bulk voltage (VBB), a source configured to connect to a node 's', and a drain configured to connect to the fourth PMOS transistor P4. The fourth PMOS transistor P4 can include the gate configured to receive the bulk voltage (VBB), a source configured to connect to the third PMOS transistor P3, a source configured to connect to the third PMOS transistor P3, and a drain configured to connect to the control unit 110.

Meanwhile, the voltage gain adjusting unit 150 according to one embodiment can be configured to control a voltage gain of the first detection signal 'DET0' for the sensed bulk voltage (VBB) by including a transistor that can be configured to allow an operation area to be varied according to the fluctuations of a voltage between the gate and the source.

The voltage gain adjusting unit 150 can include a second NMOS transistor N2. The second NMOS transistor N2 can include a gate configured to connect to the node 'a', a source configured to connect to the node 's', and a drain configured to connect to a node 'b'. The NMOS transistor N2 can be connected between the first dividing unit 120 and the second dividing unit 130. Meanwhile, it is exemplified that the second NMOS transistor N2 can be configured to receive a voltage of the node 'a', but is not limited thereto. The internal voltage (VCORE) can be applied to the second NMOS transistor N2. Moreover, a voltage higher than the voltage of the first detection signal 'DET0' can also be applied as a gate voltage of the second NMOS transistor N2.

The first inversion unit 210 can be configured to invert and amplify the first detection signal 'DET0', which can be at a weak level. The first inversion unit 210 can include a fifth PMOS transistor P5 that is a pull-up element and a third NMOS transistor N3 that is a pull-down element. Accordingly, the first inversion unit 210 can be configured to provide the second detection signal 'DET1' at, e.g., an amplified CMOS level while inverting a level of the first detection signal 'DET0'.

The fifth PMOS transistor P5 and the third NMOS transistor N3 can connect to each other to form an inverter. Therefore, gates of the fifth PMOS transistor P5 and the third NMOS transistor N3 that is the pull-down element can commonly receive the first detection signal 'DET0' and sources of the fifth PMOS transistor P5 and the third NMOS transistor N3 can receive the internal voltage (VCORE) and the ground voltage VSS, respectively.

The second inversion unit 220 can be configured to provide the third detection signal 'DET2' by inverting the second detection signal 'DET1'. The second inversion unit 220 can include a sixth PMOS transistor P6 that is the pull-up element and a fourth NMOS transistor N4 that is the pull-down element. The sixth PMOS transistor P6 and the fourth NMOS transistor N4 are also configured to connect to each other to form an inverter. Gates of the sixth PMOS transistor P6 and the fourth NMOS transistor N4 commonly can be configured to receive the second detection signal 'DET1'. A source of the sixth PMOS transistor P6 can be configured to receive the internal voltage (VCORE) and a drain of the sixth PMOS transistor P6 can be configured to connect to the fourth NMOS transistor N4.

The operation of the bulk voltage detector 10 will now be described in detail. First, a case in which the bulk voltage (VBB) is lower than the target level will be described. Put another way, the absolute value of the received bulk voltage (VBB) is larger than. In such a situation, because the actuation force of the third and fourth PMOS transistors P3 and P4 of the second dividing unit 130 increases, the voltage on the node 's' and the potential level of the first detection signal 'DET0' will be lowered.

As the source voltage (the voltage of the node 's') and the first detection signal 'DET0' are lowered in a state in which the gate voltage (the voltage of the node 'a') of the second NMOS transistor N2 is constant, the second NMOS transistor N2 can be configured to operate in a linear region, that is, to operate similar to a resistor. At the same time, the effective resistance of the second NMOS transistor N2 can be designed to be smaller than the effective resistances of the third and fourth PMOS transistors P3 and P4 by properly sizing the second NMOS transistor N2. Accordingly, the first detection signal 'DET0' can be configured to have a voltage gain similar to that in a conventional circuit, when the bulk voltage (VBB) is lower than the target level.

When the bulk voltage (VBB) has a value close to the target level, the source voltage (the voltage of the node s) of the second NMOS transistor N2 can increase. Therefore, a difference between a gate-to-source voltage and a threshold voltage of the second NMOS transistor N2 can be reduced. Accordingly, a current drive capability of the second NMOS transistor N2 can be rapidly reduced and the drain voltage (a voltage of the node b) can increase, whereby the second NMOS transistor N2 can be configured to operate in a saturation area. One of characteristics of the MOSFET transistor in the saturation area is that the current through the device can fluctuate according to fluctuation of the $V_{GS}$ (the gate-to-source voltage). As a result, the current can fluctuate greatly, even when there are only small fluctuations of the source voltage (the voltage of the node s) of the second NMOS transistor N2. As a result, wide voltage fluctuation of the second detection signal 'DET0' can occur. That is, it is possible to substantially increase the voltage gain within a predetermined bulk voltage range by configuring the second NMOS transistor as described above.

When the bulk voltage (VBB) is larger than the target level, that is, the absolute value of the bulk voltage (VBB) is smaller than an absolute value of the target level will be described. In this instance, because the first and second PMOS transistor P1 and P2 can be configured to operate in the linear region even though the voltage of the node b can increase with an increment of the (VBB), a change of the potential level of the node b, that is, the voltage gain of the first detection signal 'DET0' is at a level similar to that in a conventional circuit.

Therefore, sensitivity of the voltage sensor 100 can be improved by increasing a voltage gain in a predetermined bulk voltage sensing region. That is, it is possible to provide the first detection signal 'DET0' configured to have a more improved voltage gain in a voltage region close to the target level. This indicates that the sensitivity of the bulk voltage detector can be improved.

Meanwhile, the first detection signal 'DET0' can be provided as the third detection signal 'DET2' via the first inversion unit 210 and the second inversion unit 220.

The first detection signal 'DET0' configured to have the localized increased voltage gain can offset the fluctuation of logical threshold voltages of the first inversion unit 210 and the second inversion unit 220.

It is exemplified that the pull-up element of the first inversion unit 210 can have a threshold voltage lower than a designed value and the pull-down element of the first inversion unit 210 can have a threshold voltage higher than a designed value according to process variation.

If the third NMOS transistor N3 of the first inversion unit 210 can have a threshold higher than a value designed according to the process variation and the fifth PMOS transistor P5 can have a threshold voltage lower than a value designed according to the process variation, then the logical threshold voltage of the first inversion unit 210 can become higher than a designed or predetermined value. If the characteristic of the voltage sensor 100 is not varied according to the process variation, the increment of the logical threshold voltage of the first inversion unit 210 can be configured to cause an increment of a bulk voltage sensing level. However, the threshold voltage of the second NMOS transistor N2 of the voltage sensor 100 can also become higher than a designed value due to the process variation. As described above, when the threshold voltage of the second NMOS transistor N2 increases, the second NMOS transistor N2 can enter the saturation area at a lower source voltage (the voltage of the node s). This can indicate that the second NMOS transistor N2 can be configured to enter the saturation area under a bulk voltage condition lower than a typical process condition.

That is, even though a switching point of an output voltage to an input voltage of the first inversion unit 210 is changed by the process variation, operation in the saturation area can be shifted by reflecting the change of the switching point in the second NMOS transistor N2, fabricated using the same process, whereby the two effects can be offset and thus variation of the bulk voltage sensing level can be minimized.

Figure 3:
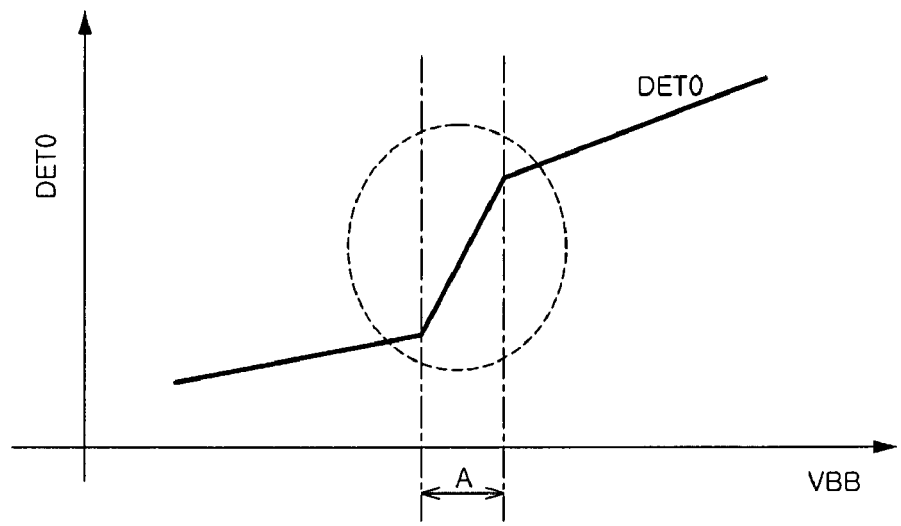
FIGS. 3 and 4 are graphs illustrating a voltage characteristic of a first detection signal.

FIG. 3 illustrates a voltage characteristic of the first detection signal 'DET0' according to the fluctuation of the bulk voltage (VBB). Referring to FIG. 3, a section (A) represents a range of the bulk voltage (VBB) around a target level. The oval identifies the range of the bulk voltage (VBB) around the target level having a steep slope, indicating an increasing gain.

Figure 4:
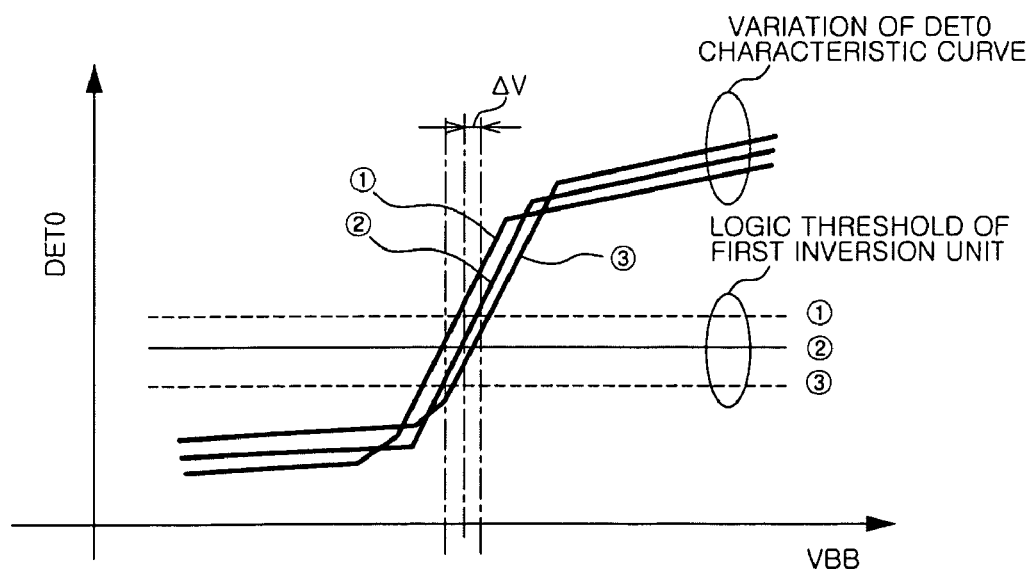

FIG. 4 is a graph illustrating the voltage characteristic of the first detection signal 'DET0' shown in FIG. 2. FIG. 4 is a voltage characteristic graph of the first detection signal 'DET0' according to the process condition.

The graph represents a case ① when a threshold voltage of an NMOS transistor is higher than a conventional threshold voltage and a threshold voltage of a PMOS transistor is lower than the conventional threshold, a case ② when both the threshold voltage of the NMOS transistor and the threshold voltage of the PMOS transistor are higher or lower than the conventional threshold voltage, and a case ③ when the threshold voltage of the NMOS transistor is lower than the conventional threshold voltage and the threshold voltage of the PMOS transistor is higher than the conventional threshold voltage.

As shown in FIG. 4, in the case ②, the logical threshold voltage of the first inversion unit 210 can be higher than that in the typical process condition when the process condition is changed similar to the case ①. But because when the first detection signal 'DET0' enters the saturation area it has already been brought ahead, the value of the bulk voltage (VBB) when the first detection signal 'DET0' passes the logical threshold voltage of the first inversion unit 210 can be substantially similar to that of the case ②. Accordingly, the bulk voltage (VBB) level relative to the target level is not changed even in the case ①. The case ③ will be able to be described for the same reason.

Figure 5:
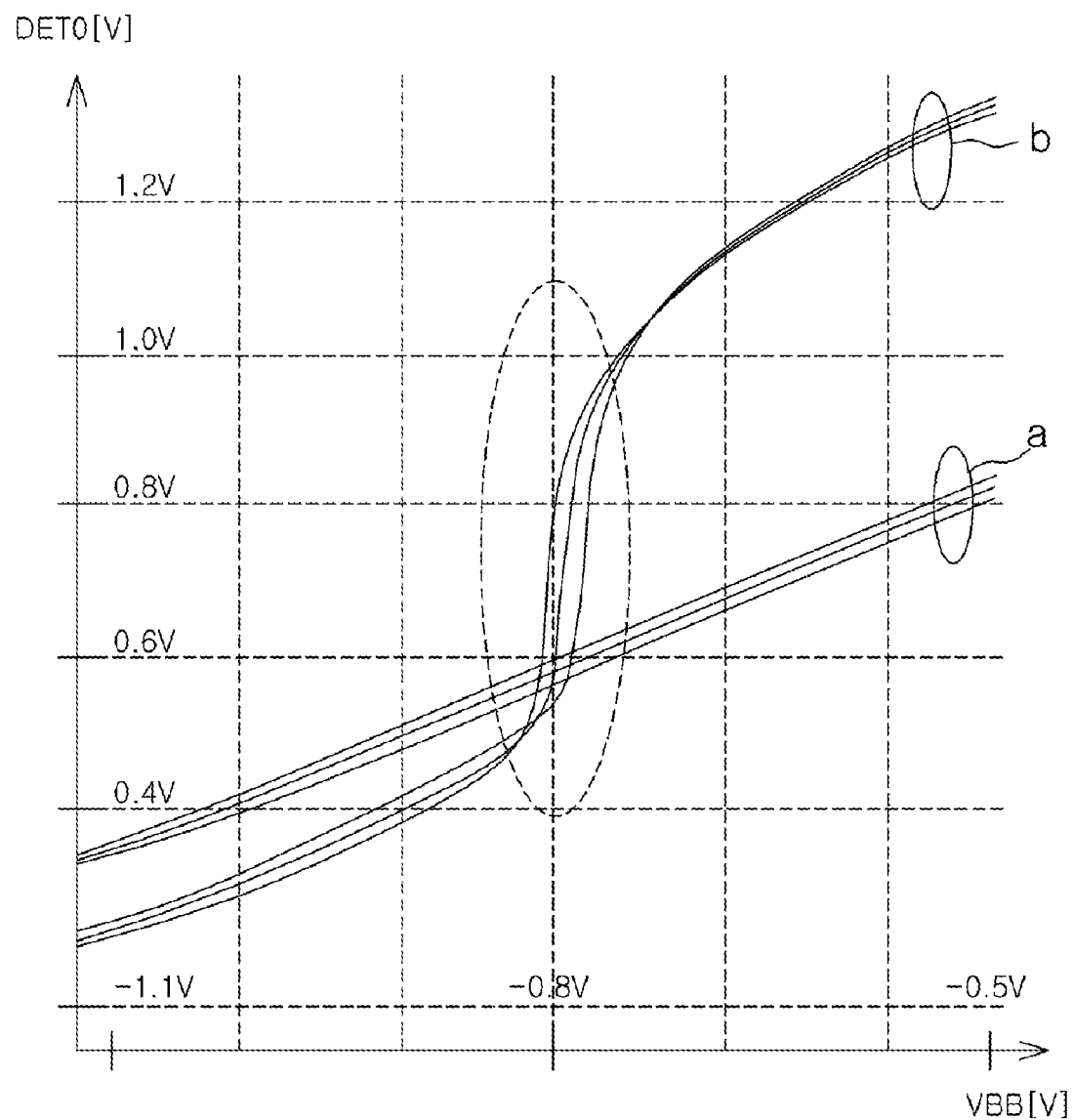
FIG. 5 is a simulation graph illustrating a voltage characteristic of the first detection signal of FIGS. 3 and 4
Figure 6:
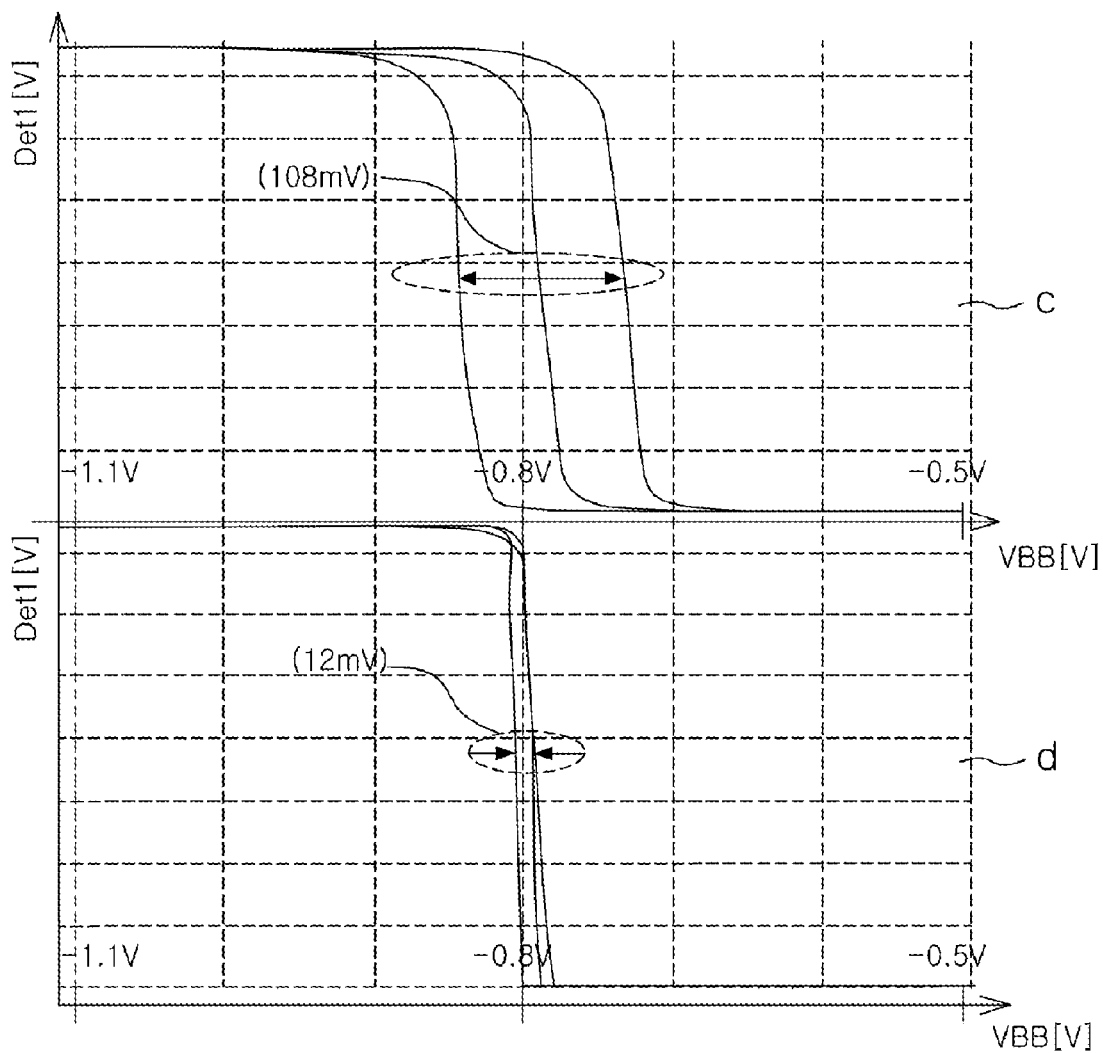
FIG. 6 is a simulation graph illustrating a sense bulk voltage level skew of a second detection signal that can be generated in the bulk voltage detector.

FIGS. 5 and 6 are simulation graphs comparing the detection operation described above to a conventional detection operation.

First, the first detection signal 'DET0' can be configured to have a predetermined slope in (a), but the first detection signal 'DET0' can have a specific section in which the slope sharply rises in (b). In such a case, a bulk voltage detector configured as described above to have improved sensitivity can be provided.

FIG. 6 is a simulation graph of comparing the second detection signal 'DET1' generated in a conventional circuit and the second detection signal 'DET1' generated as described herein. As shown in FIG. 6, in (c) the bulk voltage (VBB) in a conventional circuit can have a skew with a wide-range level. That is, a sensed point of the bulk voltage (VBB) relative to the target level can have the skew of the wide-range level. For example, a range of the level skew can be 108 mV. However, in (d), the point of the bulk voltage (VBB) relative to the target level sensed by the second detection signal 'DET1' as described herein can have a narrow-range level skew. For example, the range of the level skew can be about 12 mV.

As described above, according to the embodiments described herein, it is possible to generate a detection signal having a large voltage gain for a sensed bulk voltage in a specific section by providing a voltage gain adjusting unit. Therefore, a bulk voltage detector with improved sensitivity can be provided. A detector configured to have endurance to process variations of other elements can be provided by changing a point of time when the voltage gain adjusting unit is configured to enter an operation mode.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A bulk voltage detector comprising:
   a voltage sensor configured to receive a bulk voltage and compare the received bulk voltage with a target level to provide a first detection signal having a voltage gain that is increased when the bulk voltage has a value close to the target level; and
   an amplifier coupled with the voltage sensor, the amplifier configured to receive the first detection signal and invert and amplify the first detection signal,
   wherein the voltage sensor includes:
      a control unit configured to determine activation of the voltage sensor;
      a voltage dividing unit coupled with the control unit, the voltage dividing unit configured to be controlled by the control unit and provide the first detection signal by sensing the bulk voltage; and
      a voltage gain adjusting unit that is connected to the voltage dividing unit and configured to control a voltage gain of the first detection signal.

2. The bulk voltage detector of claim 1, wherein the voltage dividing unit includes:
   a first dividing unit configured to receive an internal voltage, dropped and adjusted from an external supply voltage, and control a potential level of the first detection signal by dividing the internal voltage at a resistance ratio in response to ground power; and
   a second dividing unit configured to control the potential level of the first detection signal at the resistance ratio in response to the bulk voltage.

3. The bulk voltage detector of claim 2, wherein the first dividing unit and the second dividing unit include a plurality of PMOS transistors connected to each other in series.

4. The bulk voltage detector of claim 3, wherein the voltage gain adjusting unit includes an NMOS transistor that is connected between the first dividing unit and the second dividing unit.

5. The bulk voltage detector of claim 4, wherein the voltage gain adjusting unit is controlled so that an operation area is changed corresponding to the fluctuations of a voltage between a gate and a source of the NMOS transistor to control a voltage gain of an output node.

6. The bulk voltage detector of claim 5, wherein the source of the NMOS transistor is connected to the second dividing unit, the gate of the NMOS transistor is connected to the first dividing unit, and a drain of the NMOS transistor is connected to the output node.

7. The bulk voltage detector of claim 1, wherein the amplifier includes:
   a first inversion unit configured to provide a second detection signal by inverting and amplifying the first detection signal; and
   a second inversion unit coupled with the first inversion unit, the second inversion unit configured to invert and amplify the second detection signal.

8. A bulk voltage detector comprising:
   a voltage sensor configured to receive a bulk voltage and compare the received bulk voltage with a target level to provide a first detection signal; and
   an amplifier coupled with the voltage sensor, the amplifier configured to receive the first detection signal and invert and amplify the first signal,
   wherein the voltage sensor includes a voltage gain adjusting unit that increases a voltage gain of the first detection signal when the bulk voltage is substantially the same as the target level;
   wherein the voltage sensor includes:
      a control unit configured to activate the voltage sensor;
      a voltage dividing unit configured to be controlled by the control unit and provide the first detection signal by sensing the bulk voltage; and
      a voltage gain adjusting unit that is connected to the voltage dividing unit and controls a voltage gain of the first detection signal.

9. The bulk voltage detector of claim 8, wherein the voltage dividing unit includes:
   a first dividing unit configured to receive an internal voltage, dropped and adjusted from an external supply voltage, and control a potential level of the first detection signal by dividing the internal voltage at a resistance ratio in response to ground power; and
   a second dividing unit configured to control the potential level of the first detection signal at the resistance ratio in response to the bulk voltage.

10. The bulk voltage detector of claim 9, wherein the first dividing unit and the second dividing unit include a plurality of PMOS transistors connected to each other in series.

11. The bulk voltage detector of claim 10, wherein the voltage gain adjusting unit includes an NMOS transistor that is connected between the first dividing unit and the second dividing unit.

12. The bulk voltage detector of claim 11, wherein the voltage gain adjusting unit is controlled so that an operation area is changed corresponding to the fluctuation of a voltage between a gate and a source of the NMOS transistor to control a voltage gain of the output node.

13. The bulk voltage detector of claim 12, wherein the source of the NMOS transistor is connected to the second dividing unit, the gate of the NMOS transistor is connected to the first dividing unit, and a drain of the NMOS transistor is connected to the output node.

14. The bulk voltage detector of claim 8, wherein the amplifier includes:
   a first inversion unit configured to provide a second detection signal by inverting and amplifying the first detection signal; and
   a second inversion unit coupled with the first inversion unit, the second inversion unit configured to invert and amplify the second detection signal.

* * * * *